United States Patent [19]
Freed

[11] Patent Number: 5,900,785
[45] Date of Patent: May 4, 1999

[54] SYSTEM AND METHOD FOR OFFSETTING LOAD SWITCHING TRANSIENTS IN A FREQUENCY SYNTHESIZER

[75] Inventor: John G. Freed, Raleigh, N.C.

[73] Assignee: Ericsson Inc., Research Triangle Park, N.C.

[21] Appl. No.: 08/748,692

[22] Filed: Nov. 13, 1996

[51] Int. Cl.[6] .............................. H03C 3/09; H03L 7/085; H03L 7/18

[52] U.S. Cl. ...................... 331/10; 331/14; 331/177 R; 332/127

[58] Field of Search .................... 331/10, 14, 34, 331/177 R; 332/127

[56] References Cited

U.S. PATENT DOCUMENTS

| | | | |
|---|---|---|---|
| 5,231,632 | 7/1993 | Yamao et al. | 370/331 |
| 5,319,800 | 6/1994 | Erbora et al. | 455/78 |
| 5,438,703 | 8/1995 | Ng et al. | 455/127 |

FOREIGN PATENT DOCUMENTS

| | | |
|---|---|---|
| 0 325 394 | 7/1989 | European Pat. Off. . |
| 05 175858 | 7/1993 | Japan . |
| 07 212269 | 8/1995 | Japan . |
| WO 92/11705 | 7/1992 | WIPO . |

*Primary Examiner*—Siegfried H. Grimm
*Attorney, Agent, or Firm*—Robert A. Samra

[57] ABSTRACT

A mechanism for reducing a frequency transient appearing at the output of a voltage controlled oscillator (VCO) in a frequency synthesizer when a load is connected to the VCO. In accordance with the present invention, the magnitude and direction of (a) the frequency transient and (b) the frequency deviation of the VCO signal in response to a reference input voltage may be measured, and those measurements used to generate a frequency correction voltage which would cause the VCO signal to deviate in an equal amplitude but in an opposite direction to the frequency transient. The frequency correction voltage then can be applied to the VCO when it is connected to the load so as to substantially cancel the frequency transient.

17 Claims, 6 Drawing Sheets

SYSTEM AND METHOD FOR OFFSETTING LOAD SWITCHING TRANSIENTS IN A FREQUENCY SYNTHESIZER

BACKGROUND OF THE INVENTION

1. Field of the Invention

The present invention relates to wireless communication systems and, more particularly, to frequency synthesizers used in mobile stations which operate (transmit and receive) on various radio frequency (RF) channels allocated to such systems. Each time a load is connected to a frequency synthesizer, there is an instantaneous change in its frequency due to the changing impedance of the load. The present invention aims to substantially reduce or eliminate such frequency changes.

2. Related Prior Art Systems

The prior art includes wireless communication systems such as cellular radio systems which have been operating in the United States since the early 1980s, and providing telephone service to an ever growing subscriber base, presently estimated at over 20 million subscribers. Cellular telephone service operates much like the fixed, wireline telephone service in homes and offices, except that radio frequencies rather than telephone wires are used to connect telephone calls to and from the mobile subscribers. Each mobile subscriber is assigned a private (10 digit) directory telephone number and is usually billed based on the amount of "airtime" he or she spends talking on the cellular telephone each month. Many of the service features available to landline telephone users (e.g., call waiting, call forwarding, three-way calling, etc.) are also generally available to mobile subscribers.

In the United States, cellular operating licenses have been awarded by the Federal Communications Commission (FCC) pursuant to a licensing scheme which divided the country into geographic service markets defined according to the 1980 Census. The major metropolitan markets are called metropolitan statistical areas (MSAs) while the smaller rural markets are called rural statistical areas (RSAs). Only two cellular licenses are awarded for operating systems in each market. These two systems, which are commonly referred to as the "A-system" and the "B-system," respectively, are assigned different radio frequency (RF) bands (blocks) in the 800 MHz range. Mobile subscribers have the freedom to subscribe to service from either the A-system or the B-system operator (or both). The local system from which service is subscribed is called the "home" system. When travelling outside the home system, a mobile subscriber may be able to obtain service in a distant system if there is a "roaming" agreement between the operators of the home and "visited" systems.

The architecture for a typical cellular radio system is shown in FIG. 1. A geographical area (e.g., a metropolitan area) is divided into several smaller, contiguous radio coverage areas, called "cells," such as cells C1–C10. The cells C1–C10 are served by a corresponding group of fixed radio stations, called "base stations," B1–B10, each of which includes a plurality of RF channel units (transceivers) that operate on a subset of the RF channels assigned to the system, as well known in the art. For illustration purposes, the base stations B1–B10 are shown in FIG. 1 to be located at the center of the cells C1–C10, respectively, and are shown to be equipped with omni-directional antennas transmitting equally in all directions. However, the base stations B1–B10 may also be located near the periphery or otherwise away from the centers of the cells C1–C10, and may illuminate the cells C1–C10 with radio signals directionally (e.g., a base station may be equipped with three directional antennas each covering a 120 degrees sector).

The RF channels allocated to any given cell (or sector) may be reallocated to a distant cell in accordance with a frequency reuse plan as is well known in the art. In each cell (or sector), at least one RF channel is used to carry control or supervisory messages, and is called the "control" or "paging/access" channel. The other RF channels are used to carry voice conversations, and are called the "voice" or "speech" channels. The cellular telephone users (mobile subscribers) in the cells C1–C10 are provided with portable (hand-held), transportable (handcarried) or mobile (car-mounted) telephone units, collectively referred to as "mobile stations," such as mobile stations M1–M5, each of which communicates with a nearby base station. Each of the mobile stations M1–M5 includes a controller (microprocessor) and a transceiver, as well known in the art. The transceiver in each mobile station may tune to any of the RF channels specified in the system (whereas each of the transceivers in the base stations B1–B10 usually operates on only one of the different RF channels used in the corresponding cell).

With continuing reference to FIG. 1, the base stations B1–B10 are connected to and controlled by a mobile telephone switching office (MTSO) 20. The MTSO 20, in turn, is connected to a central office (not specifically shown in FIG. 1) in the landline (wireline) public switched telephone network (PSTN) 22, or to a similar facility such as an integrated system digital network (ISDN). The MTSO 20 switches calls between wireline and mobile subscribers, controls signalling to the mobile stations M1–M5, compiles billing statistics, stores subscriber service profiles, and provides for the operation, maintenance and testing of the system.

Access to the cellular system of FIG. 1 by any of the mobile stations M1–M5 is controlled on the basis of a mobile identification number (MIN) and an electronic serial number (ESN) which are stored in the mobile station. The MIN is a digital representation of the 10-digit directory telephone number assigned to each mobile subscriber by the home system operator. The electronic serial number (ESN) is assigned by the manufacturer and permanently stored in the mobile station. The MIN/ESN pair is sent from the mobile station when originating a call and its validity is checked by the MTSO 20. If the MIN/ESN pair is determined to be invalid (e.g., if the ESN has been blacklisted because the mobile station was reported to be stolen), the system may deny access to the mobile station.

When turned on (powered up), each of the mobile stations M1–M5 enters the idle state (standby mode) and tunes to and continuously monitors the strongest control channel (generally, the control channel of the cell in which the mobile station is located at that moment). When moving between cells while in the idle state, the mobile station will eventually "lose" radio connection on the control channel of the "old" cell and tune to the control channel of the "new" cell. The initial tuning to, and the change of, control channel are both accomplished automatically by scanning all the control channels in operation in the cellular system to find the "best" control channel (in the United States, there are 21 "dedicated" control channels in each cellular system which means that the mobile station has to scan a maximum number of 21 RF channels). When a control channel with good reception quality is found, the mobile station remains tuned to this channel until the quality deteriorates again. In this manner, the mobile station remains "in touch" with the system and may receive or initiate a telephone call through one of the base stations B1–B10 which is connected to the MTSO 20.

To detect incoming calls, the mobile station continuously monitors the current control channel to determine whether a page message addressed to it (i.e., containing its MIN) has been received. A page message will be sent to the mobile station, for example, when an ordinary (landline) subscriber calls the mobile subscriber. The call is directed from the PSTN 22 to the MTSO 20 where the dialed number is analyzed. If the dialed number is validated, the MTSO 20 requests some or all of the base stations B1–B10 to page the called mobile station throughout their corresponding cells C1–C10. Each of the base stations B1–B10 which receive the request from the MTSO 20 will then transmit over the control channel of the corresponding cell a page message containing the MIN of the called mobile station. Each of the idle mobile stations M1–M5 which is present in that cell will compare the MIN in the page message received over the control channel with the MIN stored in the mobile station. The called mobile station with the matching MIN will automatically transmit a page response over the control channel to the base station, which then forwards the page response to the MTSO 20. Upon receiving the page response, the MTSO 20 selects an available voice channel in the cell from which the page response was received (the MTSO 20 maintains an idle channel list for this purpose), and requests the base station in that cell to order the mobilnne station via the control channel to tune to the selected voice channel. A through-connection is established once the mobile station has tuned to the selected voice channel.

When, on the other hand, a mobile subscriber initiates a call (e.g., by dialing the telephone number of an ordinary subscriber and pressing the "send" button on the telephone handset in the mobile station), the dialed number and MIN/ESN pair for the mobile station are sent over the control channel to the base station and forwarded to the MTSO 20, which validates the mobile station, assigns a voice channel and establishes a through-connection for the conversation as described before. If the mobile station moves between cells while in the conversation state, the MTSO 20 will perform a "handoff" of the call from the old base station to the new base station. The MTSO 20 selects an available voice channel in the new cell and then orders the old base station to send to the mobile station on the current voice channel in the old cell a handoff message which informs the mobile station to tune to the selected voice channel in the new cell. The handoff message is sent in a "blank and burst" mode which causes a short but hardly noticeable break in the conversation. Upon receipt of the handoff message, the mobile station tunes to the new voice channel and a through-connection is established by the MTSO 20 via the new cell. The old voice channel in the old cell is marked idle in the MTSO 20 and may be used for another conversation. Furthermore, when travelling outside the system, the mobile station may be handed off to a cell in an adjacent system if there is a roamning agreement between the operators of the two systems.

The original cellular radio systems, as described generally above, used analog transmission methods, specifically frequency modulation (FM), and duplex (two-way) RF channels in accordance with the Advanced Mobile Phone Service (AMPS) standard. According to the AMPS standard, each control or voice channel between the base station and the mobile station uses a pair of separate frequencies consisting of a forward (downlink) frequency for transmission by the base station (reception by the mobile station) and a reverse (uplink) frequency for transmission by the mobile station (reception by the base station). The AMPS system, therefore, is a single-channel-per-carrier (SCPC) system allowing for only one voice circuit (telephone conversation) per RF channel. Different users are provided access to the same set of RF channels with each user being assigned a different RF channel (pair of frequencies) in a technique known as frequency division multiple access (FDM). This original AMPS (analog) a rchitecture forms the basis for an industry standard sponsored by the Electronics Industries Association (EIA) and the Telecommunication Industry Association (TIA), and known as EIA/TIA-553.

In the late 1980s, however, the cellular industry in the United States began migrating from analog to digital technology, motivated in large part by the need to address th e steady growth in the subscriber population and the increasing demand on system capacity. It was recognized early on that the capacity improvements sought for the next generation cellular systems could be achieved by either "cell splitting" to provide more channels per subscribers in the specific areas where increased capacity is needed, or by the use of more advanced digital radio technology in those areas, or by a combination of both approaches. According to the first approach (cell splitting), by reducing the transmit power of the base station, the size of the corresponding cell (or cell radius) and, with it, the frequency reuse distance are reduced thereby resulting in more channels per geographic area (i.e., increased capacity). Additional benefits of a smaller cell include a longer "talk time" for the user since the mobile station will use substantially lower transmit power than in a larger cell and, consequently, its battery will not need to be recharged as often.

While cell splitting held the promise of improving both capacity and coverage for the growing mobile subscriber base, the actual capacity gains were limited by the use of the analog AMPS technology. It was commonly believed that the desired capacity gains, and indeed the effectiveness of the microcellular (cell splitting) concept in incre asing capacity, can be maxinized only by the use of digital technology. Thus, in an effort to go digital, the EIA/TIA developed a number of air interface standards which use digital voice encoding (analog-to-digital conversion and voice compression) and time division multiple access (TDMA) or code division multiple access (CDMA) techniques to multiply the number of voice circuits (conversations) per RF channel (i.e., to increase capacity). These standards include IS-54 (TDMA) and IS-95 (CDMA), both of which are "dual mode" standards in that they support the use of the original AMPS analog voice and control channels in addition to digital speech channels defined within the existing AMPS framework (so as to ease the transition from analog to digital and to allow the continued use of existing analog mobile stations).

The dual-mode IS-54 standard, in particular, has become known as the digital AMPS (D-AMPS) standard. More recently, the EIA/TIA has developed a new specification for D-AMPS, which includes a digital control channel suitable for supporting public or private microcell operation, extended mobile station battery life, and enhanced end-user features. This new specification builds on the IS-54B standard (the current revision of IS-54), and it is known as IS-136. (All of the foregoing EIA/TIA standards are hereby incorporated herein by reference as may be necessary for a full understanding of these background developments. Copies of these standards may be obtained from the Electronics Industries Association, 2001 Pennsylvania Avenue, N.W., Washington, D.C. 20006).

According to IS-54B and as shown in FIG. 2, each RF channel is time division multiplexed (TDM) into a series of repeating time slots which are grouped into frames carrying from three to six digital speech channels (three to six telephone conversations) depending on the source rate of the speech coder used for each digital speech channel. Each frame on the RF channel comprises six equally sized time slots (1–6) and is 40 ms long (i.e, there are 25 frames per second). The speech coder for each digital traffic channel (DTCH) can operate at either full-rate or half-rate. A full-rate DTCH uses two equally spaced slots of the frame (i.e., slots 1 and 4, or slots 2 and 5, or slots 3 and 6) for transmission or reception (the transmit and receive frames are offset from each other so that the mobile station does not have to transmit and receive simultaneously and thus can avoid using a duplexer for separating the transmit and receive signals).

When operating at full-rate, the RF channel may be assigned to three users (A–C). Thus, for example, user A is assigned to slots 1 and 4, user B is assigned to slots 2 and 5, and user C is assigned to slots 3 and 6 of the frame as shown in FIG. 2. Each half-rate DTCH uses only one time slot of the frame. At half-rate, the RF channel may be assigned to six users (A–F) with each user being assigned to one of the six slots of the frame as also shown in FIG. 2. Thus, it can be seen that the DTCH as specified in the IS-54B standard allows for an increase in capacity of from three to six times that of the analog RF channel. At call set-up or handoff, a dual-mode mobile station will be assigned preferably to a digital traffic channel (DTCH) and, if none is available, it can be assigned to an analog voice channel (AVCH). An analog-only mobile station, however, can only be assigned to an AVCH.

The IS-136 standard specifies a digital control channel (DCCH) which is defined similarly to the digital traffic channel (DTCH) specified in IS-54B (i.e., on the same set of RF channels and with the same TDMA frame format and slot size). Referring back to FIG. 2, a half-rate DCCH would occupy one slot while a full-rate DCCH would occupy two slots out of the six slots in each 40 ms frame. The DCCH slots may then be mapped into different logical channels which are organized into a series of superframes. FIG. 3 shows the superframe structure of a full-rate DCCH according to IS-136 (in this example, the DCCH is defined over channel "A" in the TDMA frame). A superframe is defined in IS-136 as the collection of 32 consecutive time slots (640 ms) for a full-rate DCCH (16 slots for a half-rate DCCH).

The logical channels specified in IS-136 include a fast, an extended and a point-to-multipoint short message service broadcast control channels (F-BCCH, E-BCCH and S-BCCH, respectively) for carrying system-related information which is broadcast to all mobile stations, and a short message service, paging and access response channel (SPACH) for carrying information which is sent to specific mobile stations (e.g., paging or text messages). An idle mobile station operating on the DCCH of FIG. 3 need only be "awake" (monitoring) during only certain time slots (e.g., the F-BCCH or its assigned PCH slot) in each DCCH superframe and can enter "sleep mode" at all other times. While in sleep mode, the mobile station turns off most internal circuitry and saves battery power. Sleep mode operation reduces battery drain in the mobile station during idle mode and, therefore, increases both "standby time" and "talk time" for the user.

The AMPS and D-AMPS standards generally described above use a common frequency plan for communications between the mobile station and the base station. According to this plan, each RF channel consists of a transmit channel (mobile station to base station) in the 824–849 MHz range, and a corresponding receive channel (base station to mobile station) in the 869–894 MHz range, with the transmit and receive center frequencies for any RF channel being separated by 45 MHz and with the center frequencies of adjacent transmit or receive channels being separated 30 KHz. FIGS. 4–5 show the structure of a transceiver (transmitter-receiver) in conventional analog and digital mobile stations, respectively.

Referring now to FIGS. 4–5, an incoming (received) signal in the 869–894 MHz range is passed through a band pass filter (BPF) 30 which attenuates out-of-band signals and noise. The output of the BPF 30 then is mixed with the output of a main channel synthesizer (first local oscillator) 32 in a mixer 34 to produce a pair of sum and difference frequencies, as well known in the art. These signal products are passed through a BPF 36 which filters out the (higher) sum frequency leaving only the difference (lower) frequency. The effect of this first mixing and filtering stage is to downconvert the received signal into a first intermediate frequency (IF) signal, which is presented at the output of the BPF 36. This first IF signal is further downconverted into a second IF signal in a second mixing and filtering stage comprised of mixer 40 and a BPF 42. In the analog transceiver (FIG. 4), the first IF is mixed with a signal from a reference oscillator 26 whose frequency has been raised in a frequency multiplier (xM) 28. In the digital transceiver (FIG. 5), the first IF is mixed with the output of an auxiliary synthesizer (second local oscillator) 38. In either case, the output of the mixer 40 is filtered in the BPF 42 so as to select the lower frequency from the mixer 40 as the second IF signal which is provided for further IF processing (not shown).

As also shown in FIGS. 4–5, the main channel synthesizer 32 can be used in conjunction with a transmit offset synthesizer 44 to upconvert a baseband signal into a signal in the desired 824–849 MHz range. In the analog transceiver (FIG. 4), an analog (audio) baseband signal is input to, and modulates a carrier signal in, the transmit offset synthesizer 44. In the digital transceiver (FIG. 5), a digital baseband signal, which may be comprised of in-phase (I) and quadrature (Q) components, is fed to an IQ modulator 46 which modulates the baseband signal onto a carrier signal provided by the transmit offset synthesizer 44. In either case, the output of the IQ modulator 46 is mixed in a mixer 48 with the output of the main channel synthesizer 32, and the output of the mixer 48 is passed through a BPF 50 so as to select the lower frequency from the mixer 48 for amplification in a power amplifier (not shown) and transmission through an antenna (also not shown).

The transceivers of FIG. 4–5 can be configured to receive or transmit in any desired RF channel in the 800 MHz range by appropriate selection or setting of the reference oscillator 26, the frequency multiplier 28, the main channel synthesizer 32, the auxiliary synthesizer 38, the transmit offset synthesizer 44, and/or the filters 30, 36, 42 and 50, as illustrated in the following examples. It will be appreciated by persons of ordinary skill in the art that the numerical frequency values given in the examples below are not necessarily exact to the Hz, but are close approximations which are used for illustration purposes.

In the analog transceiver (FIG. 4), the output of the reference oscillator 26 may be at 14.85 MHz, which may be tripled to 44.55 MHz in the frequency multiplier 28 (i.e., M=3), while the main channel synthesizer 32 can be set to operate at 914–939 MHz (depending on the particular RF channel). If the received signal is at 869 MHz, for example, the main channel synthesizer 32 can be set to 914 MHz. The mixer 34 will generate a sum frequency signal at 1783 MHz and a difference frequency signal at 45 MHz. The higher frequency is filtered out in the BPF 36 and the lower frequency at 45 MHz is mixed with the 44.55 MHz signal from the frequency multiplier 28. The mixer 40 will generate a sum frequency signal at 89.55 MHz and a difference frequency signal at 0.45 MHz (450 KHz). The higher frequency is filtered out in the BPF 42 and the lower frequency at 450 KHz is delivered for further IF processing.

Continuing with the foregoing example for the analog transceiver, in the transmit direction an audio signal at 300–3000 Hz is fed to the transmit offset synthesizer 44, which may be set to operate at 90 MHz. The modulated output of the transmit offset synthesizer 44 is mixed with the 914 MHz signal from the main channel synthesizer 32. The mixer 48 will generate a sum frequency signal at 1004 MHz and a difference frequency signal at 824 MHz. The higher frequency is filtered out in the BPF 50 leaving the desired transmit frequency at 824 MHz for delivery to the power amplifier and then to the antenna.

In the digital transceiver (FIG. 5), the main channel synthesizer 32 can be set to operate at 941–966 MHz (depending on the particular RF channel). If the received signal is at 869 MHz, for example, the main channel synthesizer 32 can be set to 941 MHz. The mixer 34 will generate a sum frequency signal at 1810 MHz and a difference frequency signal at 72 MHz. The higher frequency is filtered out in the BPF 36 and the lower frequency at 72 MHz is mixed with the output of the auxiliary synthesizer 38, whose frequency may be set to 71.4 MHz. The mixer 40 will generate a sum frequency signal at 143.4 MHz and a difference frequency signal at 0.6 MHz (600 KHz). The higher frequency is filtered out in the BPF 42 and the lower frequency at 600 KHz is delivered for further IF processing.

Continuing with the foregoing example for the digital transceiver, in the transmit direction the transmit offset synthesizer 44 may be set to operate at 117 MHz. This carrier frequency is modulated in the IQ modulator 46 and mixed with the 941 MHz signal from the main channel synthesizer 32. The mixer 48 will generate a sum frequency signal at 1058 MHz and a difference frequency signal at 824 MHz. The higher frequency is filtered out in the BPF 50 leaving the desired transmit frequency at 824 MHz for delivery to the power amplifier and then to the antenna.

In practice, the transmit offset synthesizer 44 (FIGS. 4–5) is switched on and off as needed. For example, in the analog transceiver (FIG. 4), the transmit offset synthesizer 44 will be switched off when the mobile station is in idle mode, receiving the ACCH but not transmitting, and will be switched on only when transmitting a message on the ACCH or when the mobile station is engaged in a call on the AVCH. In the digital transceiver (FIG. 5), the transmit offset synthesizer 44 will be switched off when the mobile station is in idle or sleep mode on the DCCH and will be switched on only when transmitting a message on the DCCH or speech on the DTCH. After the transmit offset synthesizer 44 is turned on and connected to a load, its output experiences an instantaneous frequency change which is sometimes referred to as a frequency "jump" or "kick" by those skilled in the art. This frequency jump is described more specifically below with reference to FIGS. 6–7.

Referring now to FIG. 6, as well known in the art, a frequency synthesizer, such as the transmit offset synthesizer 44 in FIG. 4, is comprised of a phase locked loop (PLL) including a voltage controlled oscillator (VCO) 60, a programmable frequency divider (divide-by-N operator) 62, a phase detector (comparator) 64, and a loop filter 66. The phase detector 64 derives a reference frequency signal from an available reference frequency generator such as the reference oscillator 26. As well known in the art, the VCO 60 can adjust its output frequency in proportion to the voltage applied at its input. The VCO 60 may be tuned to a desired frequency by selecting an appropriate value for the divide ratio "N" in the divider 62. The phase detector 64 compares the phase of the frequency divided VCO signal at the output of the frequency divider 62 to the phase of the reference signal from the reference oscillator 26, and generates an error voltage signal in proportion to the phase difference. This error voltage signal is smoothed in the loop filter 66 and input to the VCO 60 so as to fine tune the frequency of the VCO 60 until it matches the frequency of the reference signal when multiplied by N. In the case of the transmit offset synthesizer 44 of FIG. 4, an audio signal also is input to the VCO 60 using an adder 68. In this case, the loop filter 66 acts as a low pass filter for the error signal from the phase detector 64 and as a high pass filter for the audio feedback signal.

With continuing reference to FIG. 6, the output of the VCO 60 in, for example, the transmit offset synthesizer 44 of FIG. 4 is connected through a switch 70 to a load 72 comprising one or more switched stages in the transmit signal path, such as a variable gain or buffer amplifier and a power amplifier (not specifically shown). In practice, the transmit offset synthesizer 44 is usually turned on, the desired frequency (i.e., the "N" value) selected and the frequency of the output of the VCO 60 allowed to settle in response to the application of any error voltage. Thereafter, the switch 70 is closed and the stages in the load 72 successively powered up (e.g., by turning on the buffer amplifier followed by the power amplifier). However, because of changes in the impedance "Z" of the load 72 or the presence of a supply voltage transient, the output of the VCO 60 may take an instantaneous frequency step, which then must be "tracked out" by the feedback loop in the frequency synthesizer 44.

An example of the frequency behavior of the VCO 60 at power up of the transmitter is shown in FIG. 7. In this example, the desired frequency for the VCO 60 is 90 MHz as described in connection with FIG. 4. At t=0 (with the load 72 disconnected) the VCO 60 is turned on and its frequency eventually settles to 90 MHz at t=20 ms. At t=51 ms, the load 72 is switched in and powered up. The frequency of the VCO 60 immediately jumps from 90 MHz to 90.04 MHz, or a step of 40 KHz. The feedback loop then begins to correct for this transient and the frequency of the VCO 60 ultimately settles back to 90 MHz at t=68 ms.

The example in FIG. 7 highlights two significant deficiencies in the design of a conventional frequency synthesizer. First, it can be seen that the frequency jump caused by the turning on of the transmitter (load) 72 well exceeded the 30 KHz channel width specified for proper mobile station operation in AMPS and D-AMPS, for example. Hence, such a frequency jump can interfere with the operation of the base station and other mobile stations. Furthermore, if the mobile station is operating at a frequency which is close to the edge of the transmit band, such a frequency jump may result in the mobile station operating out of band. In some conventional designs, even higher frequency jumps on the order of several hundred KHz have been observed with even greater potential for causing interference and/or out-of-band operation. In addition, it will be noted that it took a relatively long time (17 ms) for the VCO 60 to settle back to its desired frequency after the onset of the frequency transient. This, in turn, causes a longer delay in establishing communications between the mobile station and the base station.

The prior art has attempted several techniques for minimizing the effects of the frequency transients illustrated in FIG. 7. One common approach has been to use several unswitched buffer stages (e.g., transistor amplifiers) to provide isolation between the VCO 60 and the load 72. While this approach is at least somewhat effective in reducing the frequency transient, it is not practical for use in mobile stations due to high parts count, current drain and cost.

Another approach, which is more practical for the mobile station environment, has been to control the turn-on time of the switched stages in the transmitter (load) 72 so that these stages turn on more slowly and the frequency transient can be effectively tracked out by the feedback loop. However, this other approach is difficult to reconcile with the requirements of industry standards such as IS-19B, which specifies that the transmitter turn-on (switching) time must be no more than 2 ms.

Yet another approach has been to increase the bandwidth of the loop filter 66 during the transmitter turn-on time. However, this third approach does not actually reduce or prevent the occurrence of the frequency step but only allows the synthesizer loop to more quickly track out the error and settle the VCO 60 at the desired frequency. Furthermore, this approach requires additional hardware and software and also introduces the possibility that an additional frequency transient will appear at the output of the VCO 60 when the loop filter 66 is returned to its original (narrower) bandwidth.

In light of the shortcomings of the prior art, there is a need for a frequency synthesizer which is able to minimize or eliminate frequency transients caused by transmitter turn-on through a more effective and lower cost and complexity circuit as compared with prior art circuits.

SUMMARY OF THE INVENTION

In general terms, the present invention is directed to a frequency synthesizer which includes a voltage controlled oscillator (VCO) for generating a frequency signal, the frequency of the VCO signal being tunable in proportion to an input voltage applied to the VCO and the VCO being switchably connected to or disconnected from a load. The present invention provides a method and a circuit for reducing or eliminating a frequency transient appearing at the output of the VCO when it is connected to the load. The load may include, for example, a power amplifier and other switched circuitry in the transmitter of a mobile station having a varying impedance which causes such a frequency transient at turn-on of the transmitter.

In a general aspect, the method of the present invention comprises the steps of measuring the magnitude and direction of the frequency transient; measuring the magnitude and direction of the frequency deviation of the VCO signal in response to a reference voltage; generating a frequency correction voltage which, based on those measurements, would cause the VCO signal to deviate in an equal amplitude but in an opposite direction to the frequency transient; and applying the frequency correction voltage to the VCO when the VCO is connected to the load so as to substantially cancel the frequency transient. The frequency correction voltage may be generated using a predetermined voltage divider connected to a predetermined voltage source. Alternatively, the frequency correction voltage may be generated in a digital-to-analog converter (DAC) which converts a predetermined digital value to the frequency correction voltage. The digital value may be selected from a plurality of digital values stored in a memory, based on the frequency of the VCO signal or, alternatively, computed as a function of the frequency of the VCO signal.

Also in a general aspect, the frequency synthesizer circuit of the present invention comprises a voltage controlled oscillator (VCO) for generating a frequency signal; means for tuning the VCO signal to a selectable frequency; means for connecting the VCO to a load, the VCO signal having an instantaneous frequency change when the VCO is connected to the load; means for generating a predetermined offset signal for counteracting the instantaneous frequency change in the VCO signal; and means for applying the offset signal to the VCO when the VCO is connected to the load, the offset signal acting to substantially reduce the instantaneous frequency change in the VCO signal. The tuning means may comprise a programmable frequency divider for dividing the frequency of the VCO signal; a phase detector for comparing the output of the divider to a reference signal and for generating an error signal; and a loop filter for filtering the error signal into a tuning signal which is applied to the VCO. Several embodiments of the generating means and the applying means may be used in the frequency synthesizer circuit of the present invention.

In one embodiment of the frequency synthesizer circuit, the generating means may comprise a voltage source having a predetermined voltage $V_1$; and a voltage divider for dividing $V_1$ into a predetermined voltage $V_2$ for use as the offset signal. In this embodiment, the applying means may comprise a first adder for adding an audio signal to the $V_2$ signal; and a second adder at the input to the VCO for adding the output of the first adder to the tuning signal. Also in this embodiment, the connecting means may comprise a first switch for connecting the VCO to the load; and the applying means may further comprise a second switch for connecting the voltage source to the voltage divider, the second switch being activated when the first switch is activated.

In another embodiment of the frequency synthesizer circuit, the generating means may comprise a memory for storing a plurality of possible values for the offset signal, each of the values corresponding to a different frequency that can be selected for the VCO signal, and the memory outputting one of the stored offset values in response to an address signal indicative of the frequency selection; and a digital-to-analog converter (DAC) for converting any of the stored offset values into the offset signal. The address signal may be provided by the frequency divider. In this embodiment, the applying means may comprise a first adder for adding an audio signal to the offset signal from the DAC; and a second adder at the input to the VCO for adding the output of the first adder to the tuning signal. Also in this embodiment, the connecting means may comprise a first switch for connecting the VCO to the load; and the applying means may further comprise a second switch for connecting the DAC to the first adder, the second switch being activated when the first switch is activated.

In yet another embodiment of the frequency synthesizer circuit, the generating means comprises means for computing a value for the offset signal as a function of the frequency selected for the VCO signal; and a digital-to-analog converter (DAC) for converting the value into the offset signal. In this embodiment, the applying means may comprise a first adder for adding an audio signal to the offset signal from the DAC; and a second adder at the input to the VCO for adding the output of the first adder to the tuning signal. Also in this embodiment, the connecting means may comprise a first switch for connecting the VCO to the load; and the applying means may further comprise a second switch for connecting the DAC to the first adder, the second switch being activated when the first switch is activated.

In any of the foregoing embodiments of the frequency synthesizer circuit of the present invention, the generating means may further comprise means for varying the offset signal in response to changes in the impedance of, or the power supplied to, the load so as to maximize the transient cancellation effect of the offset signal.

The present invention can be applied to analog and/or digital mobile stations. An analog mobile station constructed in accordance with the present invention may comprise means for detecting a baseband analog signal; a frequency synthesizer including a voltage controlled oscillator (VCO) for generating a transmit signal at a selectable frequency, the VCO having a modulation input for receiving the analog signal for modulation onto the transmit signal; a transmitter for transmitting the modulated transmit signal from the VCO; and means for generating a frequency correction signal to substantially cancel a frequency transient appearing at the output of the VCO when the transmitter is turned on, the frequency correction signal being applied to the modulation input of the VCO. The frequency correction signal for the analog mobile station may be generated as described above for the various embodiment of the frequency synthesizer circuit of the present invention.

A digital mobile station constructed in accordance with the present invention may comprise means for processing an analog signal into an in-phase (I) signal and a quadrature (Q) signal; a frequency synthesizer including a voltage controlled oscillator (VCO) for generating a transmit signal at a selectable frequency; an IQ modulator for modulating the transmit signal with the I and Q signals; a transmitter for transmitting the modulated transmit signal from the IQ modulator; and means for generating a frequency correction signal to substantially cancel a frequency transient appearing at the output of the VCO when the transmitter is turned on, the frequency correction signal being applied to the IQ modulator. The generating means may comprise means for providing a digital value representative of the frequency correction signal. The digital value may be retrieved from a memory which stores a plurality of precomputed digital values each corresponding to a different frequency that can be selected for the VCO signal, the memory being addressed by a signal from a programmable frequency divider in the synthesizer, and the address signal being indicative of the selected frequency for the VCO signal. Alternatively, the digital value may be computed as a function of the frequency selected for the VCO signal.

In either the analog or digital mobile station of the present invention, the generating means may further comprise means for varying the frequency correction signal in response to changes in the impedance of, or the power supplied to, the transmitter.

These and other aspects, objects and advantages of the present invention will become readily apparent from the accompanying drawings and the detailed description as set forth below.

BRIEF DESCRIPTION OF THE DRAWINGS

The present invention will be better understood and its numerous objects and advantages will become apparent to those skilled in the art by reference to the following drawings in which:

FIG. 7 illustrates a frequency transient appearing at the output of the VCO of FIG. 6 when the load is switched in;

DETAILED DESCRIPTION

Figure 8:
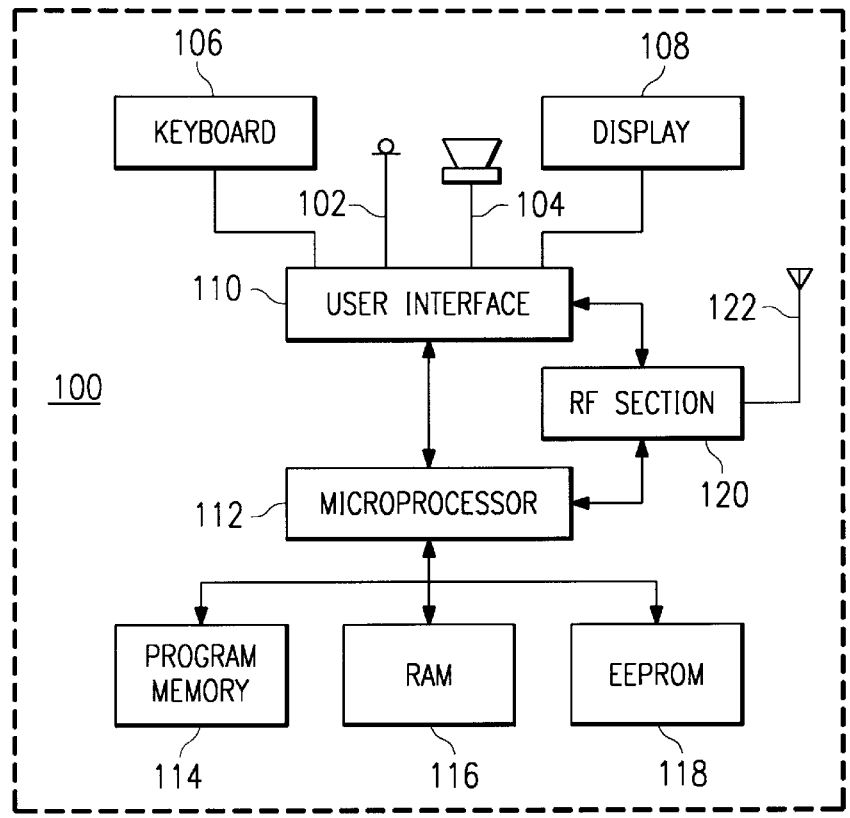
FIG. 8 is a simplified block diagram of a mobile station which may be used in accordance with the present invention.

Referring now to FIG. 8, there is shown a simplified block diagram of an exemplary mobile station 100 which may be used in accordance with the present invention. The mobile station 100 comprises a microphone 102, a loudspeaker 104, a keyboard or keypad 106, an alphanumeric or graphical display 108, a user interface 110, a microprocessor 112, a program memory 114, a random access memory (RAM) 116, an electrically erasable programmable read only memory (EEPROM) 118, a radio frequency (RF) section 120 and an antenna 122.

The user interface 110 includes speech and/or data processing circuitry (not specifically shown) for supporting analog and/or digital operation of the mobile station. For analog operation, the user interface 110 may include, for example, a compandor for compressing the dynamic range of the audio signal from the microphone 102, and an expandor for performing the reverse operation on a received audio signal destined for the loudspeaker 104, and possibly other signal conditioning circuitry. In the analog operation, the user interface 110 may supply the conditioned analog (audio) signal to the RF section 120. For digital operation, the user interface 110 may include a codec for performing analog-to-digital (A/D) conversion of a transmit speech signal from the microphone 102 and digital-to-analog (D/A) conversion of a received speech signal destined for the loudspeaker 104, and may further include a digital signal processor (DSP) for performing gain/attenuation, filtering, compression/decompression, channel coding/decoding and any other desired processing (e.g., in accordance with the D-AMPS standard) of speech and user or control data. In the digital operation, the user interface 110 may supply in-phase (I) and quadrature (Q) modulation waveforms to the RF section 120.

The microprocessor 112 controls the overall operation of the mobile station 100 through software programs stored in the program memory 114. These programs may include, for example, executable instructions for each of the transmit and receive operations on the analog control channel (ACCH), analog voice channel (AVCH), digital control channel (DCCH) and/or the digital traffic channel (DTCH) as specified, for example, in the AMPS and/or D-AMPS standards. The RAM 116 holds the values of temporary variables used in the execution of these instructions. Parameters whose values must be preserved after power is turned off in the mobile station 100 may be stored in the EEPROM 118 (or in a similar non-volatile or flash memory). Such parameters may include, for example, the mobile identification number (MIN), the electronic serial number (ESN) of the mobile station 100, and the system identification of the home system (SIDH) of the mobile station 100.

Figure 1:
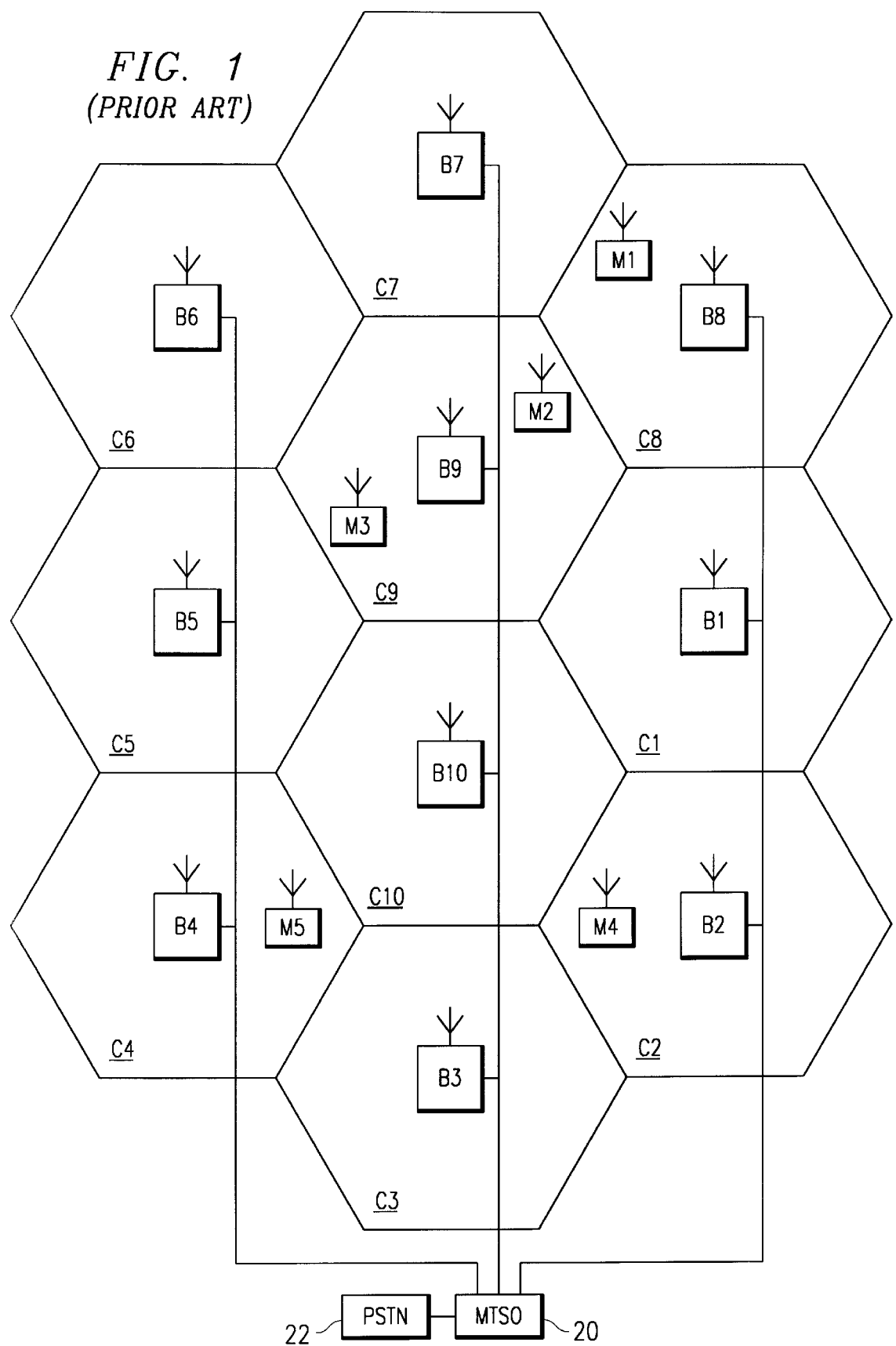
FIG. 1 shows the architecture of a conventional cellular radio system including a plurality of mobile stations and base stations communicating over a plurality of radio frequency (RF) channels.
Figure 2:
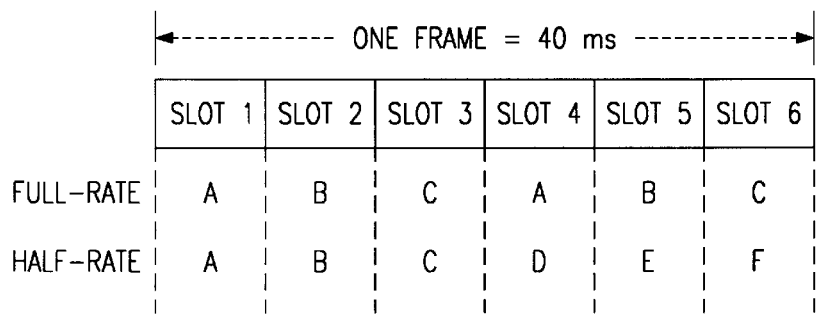
FIG. 2 shows the structure of a time division multiplexed (TDM) RF channel according to IS-54B, a known industry standard.
Figure 3:
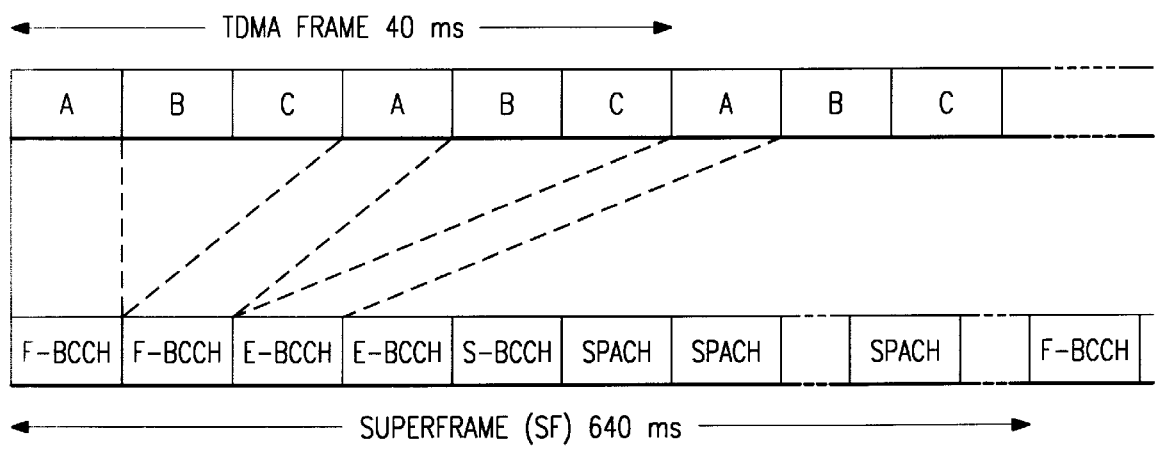
FIG. 3 shows the structure for a superframe of a digital control channel (DCCH) defined over the TDM RF channel shown in FIG. 2 as specified in IS-136, a known industry standard.
Figure 4:
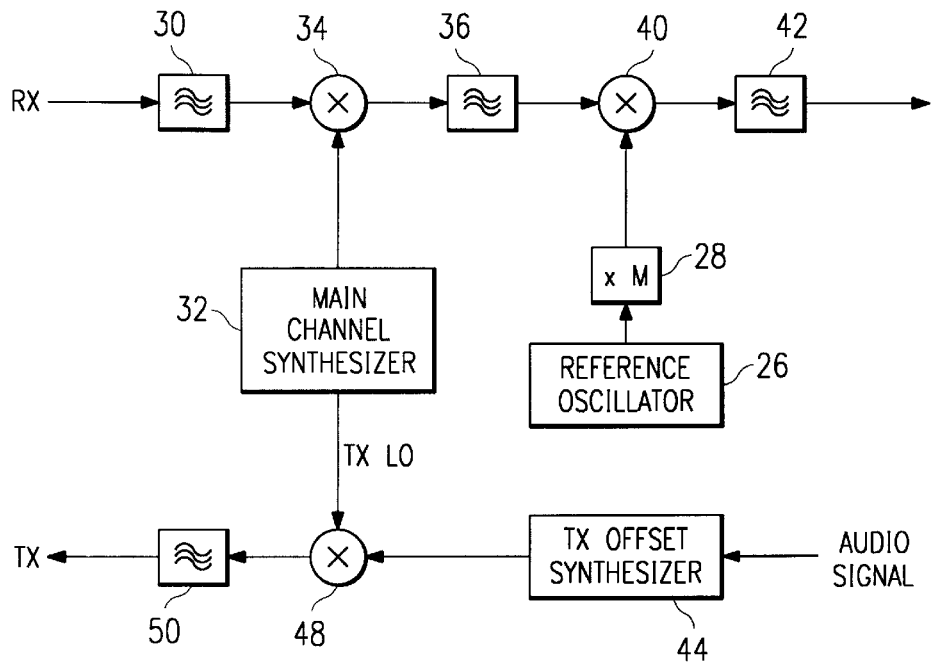
FIG. 4 is a block diagram of conventional analog transceiver.
Figure 5:
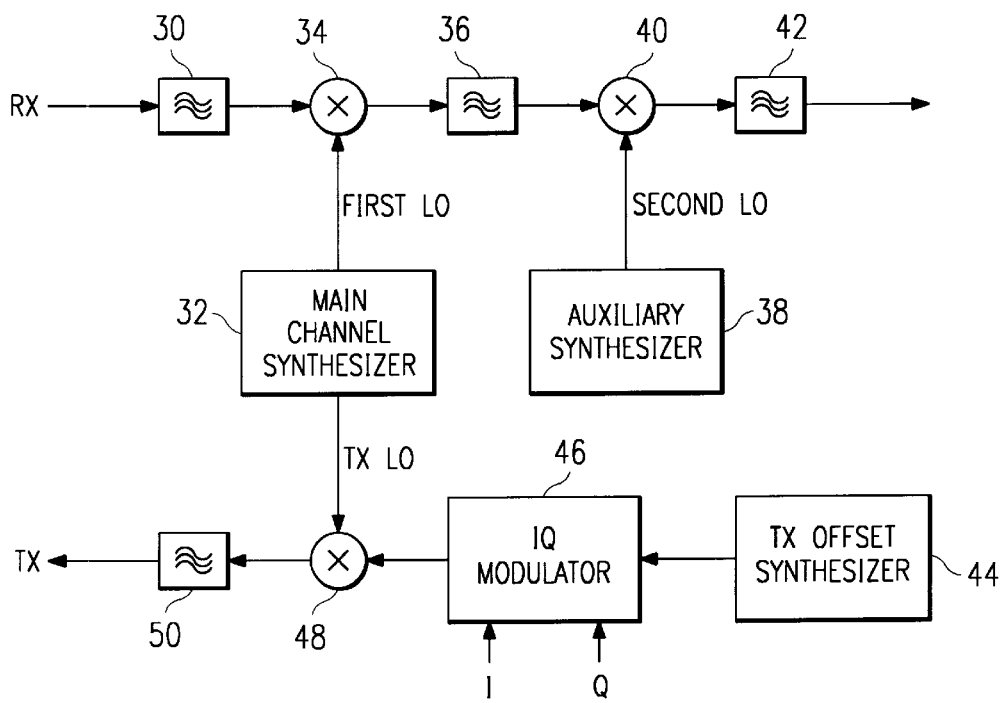
FIG. 5 is a block diagram of conventional digital transceiver.
Figure 6:
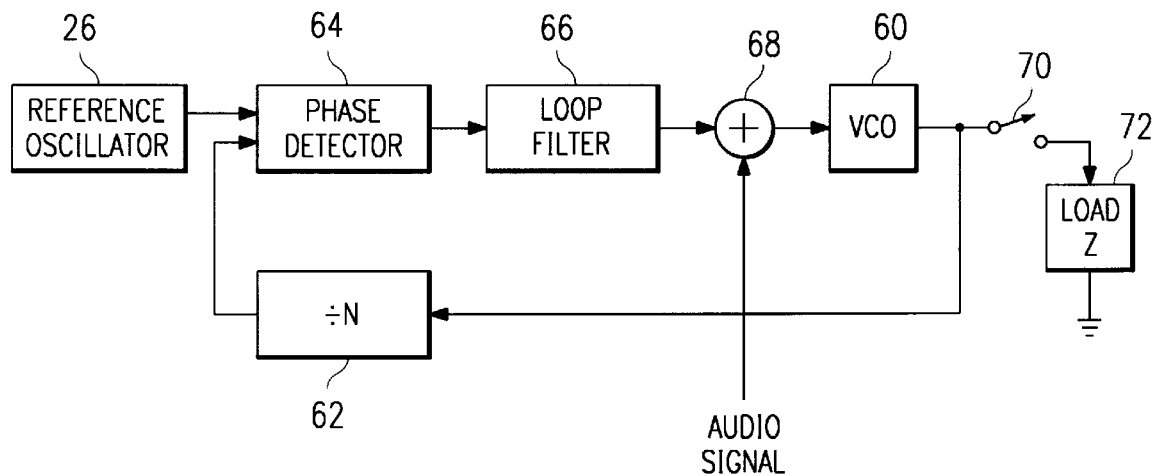
FIG. 6 is a block diagram of the transmit offset synthesizer shown in FIG. 4, the synthesizer including a voltage controlled oscillator (VCO) which is switchably connected to a load.
Figure 9:
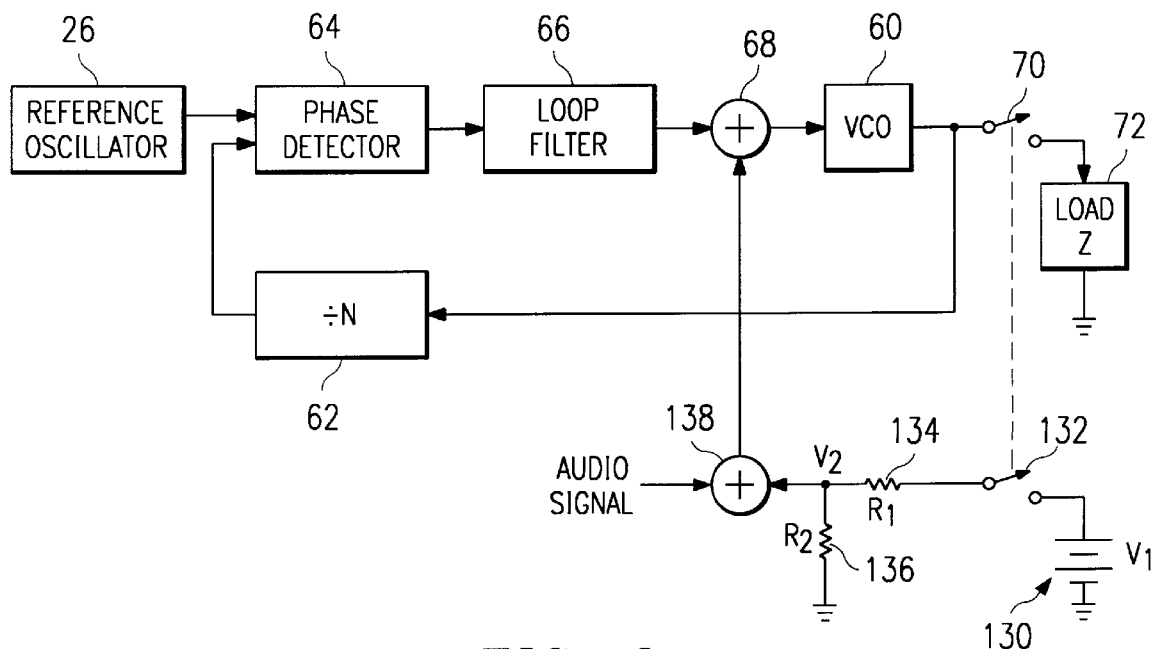
FIG. 9 is a block diagram of one embodiment of the frequency synthesizer circuit of the present invention.

Generally speaking, the RF section 120 in FIG. 8 includes an analog transceiver as shown in FIG. 4 or a digital transceiver as shown in FIG. 5. However the transmit offset synthesizer 44 in the mobile station 100 of the present invention is coupled to a circuit which is designed to substantially reduce or eliminate frequency transients of the type shown in FIG. 7. FIG. 9 shows an embodiment of this inventive circuit coupled to the transmit offset synthesizer 44 for an analog transceiver (first shown in FIG. 6). In this embodiment, a voltage source 130 having a voltage "$V_1$" is switched by a switch 132 to a voltage divider comprised of resistors 134 and 136 having resistances "$R_1$" and "$R_2$", respectively. The voltage source 130 may be any regulated voltage which is available in the mobile station 100 (such as the voltage used to drive the microprocessor 112 or the RF section 120). The voltage "$V_2$" across the resistor 136 is combined in an adder 138 with the voltage of the audio signal, and the combined voltage then is input to the adder 68.

According to the present invention, the voltage $V_2$ is used to offset the frequency transient at the output of the VCO 60. The required value of $V_2$ is determined from measurements of (a) the magnitude and direction of the frequency transient when the load 72 is disconnected and then connected to the VCO 60, and (b) the sensitivity of the VCO 60 to the voltage of the audio signal, that is, the output carrier frequency deviation in Hz which would be caused by a one volt modulation input. For example, if the frequency of the VCO 60 is "pulled" 40 KHz in one direction when the load 72 is switched in, and if the sensitivity of the VCO 60 to the audio signal is 10 KHz/volt, then $V_2$ should be 4 volts with a polarity which usually would cause the VCO 60 to pull 40 KHz in the opposite direction. Once the value of $V_2$ is determined (and with the value of $V_1$ known), an appropriate combination of values for $R_1$ and $R_2$ can be readily determined using the well known voltage divider relationship $V_2=(V_1 \times R_2)/(R_1+R_2)$. Thereafter, each time the switch 70 is closed and the VCO 60 connected to the load 72, the switch 132 is synchronously closed and the offset voltage $V_2$ combined with the audio signal voltage.

Figure 7:
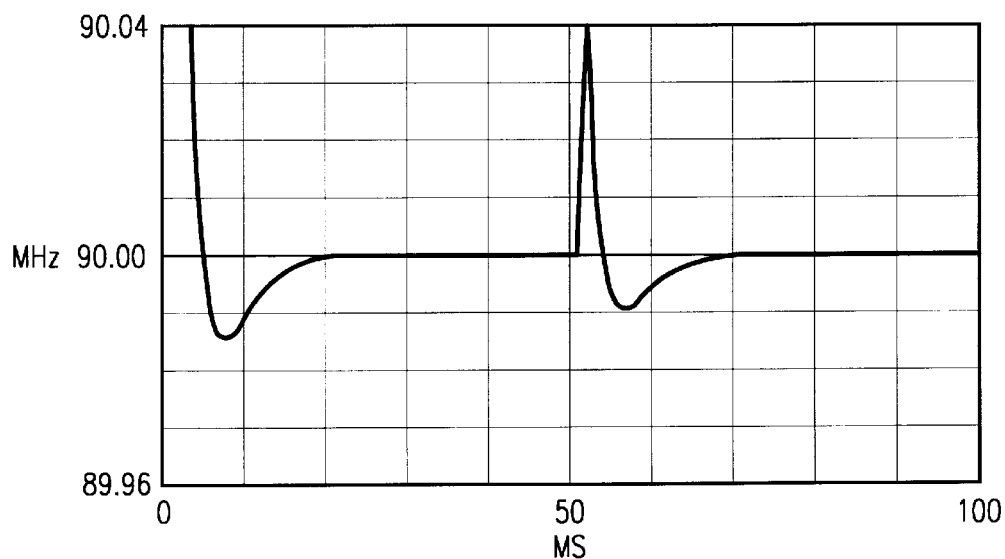
Figure 10:
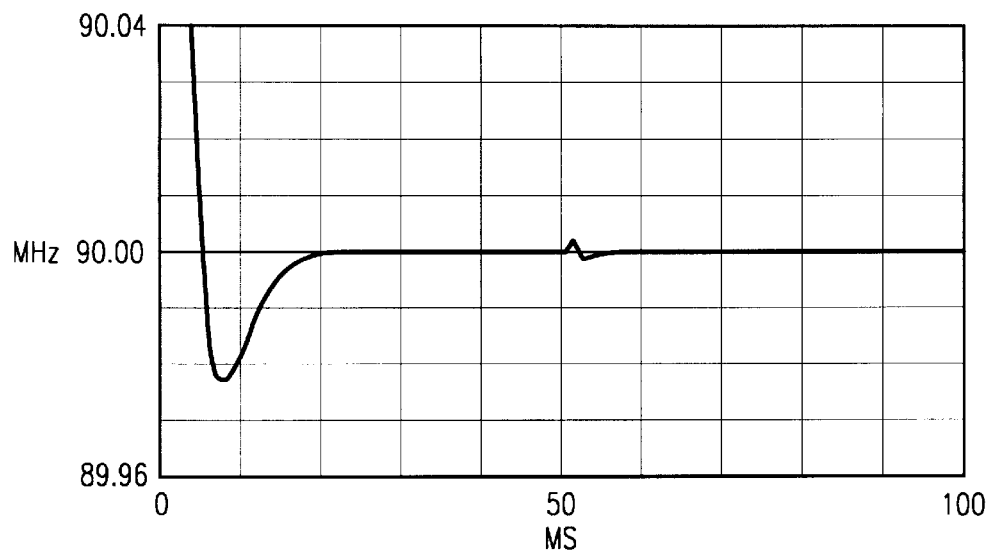
FIG. 10 illustrates the reduction in the magnitude and duration of the frequency transient in the circuit of FIG. 9.

FIG. 10 illustrates the benefits of the present invention for the operation of the VCO 60 and should be compared with the corresponding operation in the prior art as depicted in FIG. 7. With the circuit of the present invention coupled to the VCO 60, the magnitude of the frequency transient at turn-on is much less in FIG. 10 (2.5 KHz) than for the prior art in FIG. 7 (40 KHz) and also is much less than the required channel bandwidth (30 KHz). Furthermore, the present invention allows the VCO 60 to settle to the desired frequency far more quickly (5 ms) than in the prior art of FIG. 7 (17 ms).

Figure 11:
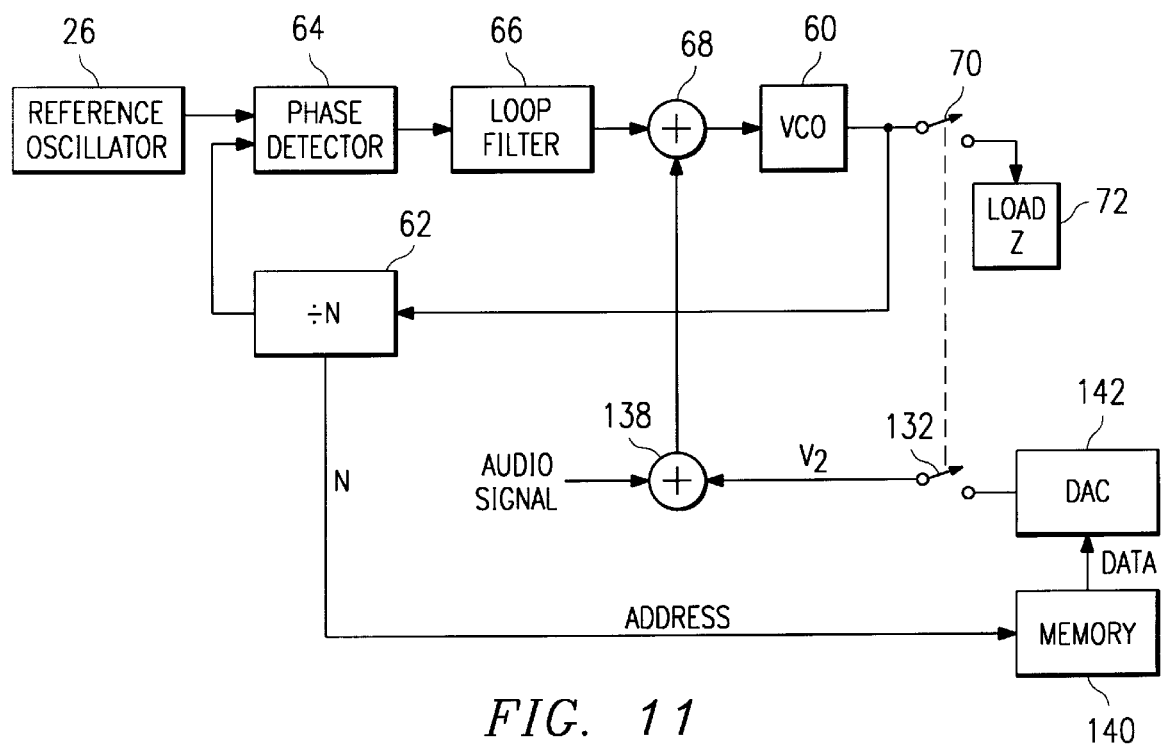
FIG. 11 is a block diagram of an alternative embodiment of the frequency synthesizer circuit of the present invention.

As will be readily recognized by those skilled in the art, the offset input voltage $V_2$, which is used to counter the frequency transient at the output of the VCO 60 in accordance with the present invention, may be generated in several ways. FIG. 11 shows an alternative embodiment of the circuit of the present invention in which the value of the divide ratio "N" is supplied as an address to a memory 140 which stores a plurality of precomputed digital offset voltage values, one for each possible value of N. The corresponding offset voltage value is read out of the memory 140 and fed to a digital-to-analog converter (DAC) 142 which converts the input digital value to a corresponding output voltage $V_2$ for combining with the audio signal as before.

The embodiment shown in FIG. 11 may be used, for example, in applications where (a) the magnitude and/or direction of the frequency transient and/or (i) the sensitivity of the VCO 60 to the modulation input is dependent on the frequency of the selected transmit channel. Since the value of N is indicative of this selection, N can be used as the basis for selecting from the memory 140 a particular value which will produce a voltage signal $V_2$ having the most appropriate magnitude and/or polarity given the current operating frequency.

It will be appreciated that many modifications and variations may be made to the foregoing embodiments of the present invention. For example, in FIG. 11 the input values to the DAC 142 may be calculated in an algorithm who se output is a function of N instead of being selected from the memory 140 based on the address N. As another example, FIG. 9 and/or FIG. 11 may further include a means for varying $V_2$ in response to differences in the impedance Z of the load 72 due to changing ambient temperatures and/or the use of selectable antennas, dual transmit and receive bands (e.g., in the 800 and 1900 MHz ranges) or different power supply voltages (e.g., different types of batteries or same battery in different states of discharge) in the mobile station 100.

It will be further appreciated that although the foregoing embodiments of the present invention have been illustrated, for convenience, in the context of the analog transceiver of FIG. 4, the present invention is equally applicable in the context of the digital transceiver of FIG. 5. Referring to FIG. 5, the offset voltage $V_2$ may be entered as a digital input to the IQ modulator 46 and used to cancel or offset any frequency transient at the output of the transmit offset synthesizer 44. In th is case, as before, the value of $V_2$ for any operating frequency may be selected from a memory, calculated by an algorithm and/or varied in response to the presence of a different load impedance.

In general, many alternative embodiments may be constructed by persons of ordinary skill in the art without substantially departing from the spirit and scope of the teachings of the present invention as disclosed herein. Thus, it will be appreciated that the forms of the invention disclosed herein are exemplary and are not intended as a limitation on the scope of the present invention as defined in the following claims.

I claim:

1. A frequency synthesizer circuit comprising:
    a voltage controlled oscillator (VCO) for generating a frequency signal;
    means for tuning said VCO signal to a selectable frequency;
    means for connecting said VCO to a load, said VCO signal having an instantaneous frequency change when said VCO is connected to said load;
    means for generating a predetermined offset signal for counteracting said instantaneous frequency change in said VCO signal, said offset signal being varied in response to changes in the impedance of, or the power supplied to, said load; and
    means for applying said offset signal to said VCO when said VCO is connected to said load, said offset signal acting to substantially reduce said instantaneous frequency change in said VCO signal.

2. The circuit of claim 1 wherein said tuning means comprises:
    a programmable frequency divider for dividing the frequency of said VCO signal;
    a phase detector for comparing the output of said divider to a reference signal and for generating an error signal; and
    a loop filter for filtering said error signal into a tuning signal which is applied to said VCO.

3. The circuit of claim 2 wherein said generating means comprises:
   a voltage source having a predetermined voltage $V_1$; and
   a voltage divider for dividing $V_1$ into a predetermined voltage $V_2$ for use as said offset signal.

4. The circuit of claim 3 wherein said applying means comprises:
   a first adder for adding an audio signal to said $V_2$ signal; and
   a second adder at the input to said VCO for adding the output of said first adder to said tuning signal.

5. The circuit of claim 3 wherein:
   said connecting means comprises a first switch for connecting said VCO to said load; and
   said applying means further comprises a second switch for connecting said voltage source to said voltage divider, said second switch being activated when said first switch is activated.

6. A frequency synthesizer circuit comprising:
   a voltage controlled oscillator (VCO) for generating a frequency signal;
   means for tuning said VCO signal to a selectable frequency;
   means for connecting said VCO to a load, said VCO signal having an instantaneous frequency change when said VCO is connected to said load;
   means for generating a predetermined offset signal for counteracting said instantaneous frequency change in said VCO signal; and
   means for applying said offset signal to said VCO when said VCO is connected to said load, said offset signal acting to substantially reduce said instantaneous frequency change in said VCO signal; and
   wherein said generating means comprises:
      a memory for storing a plurality of possible values for said offset signal, each of said values corresponding to a different frequency that can be selected for said VCO signal, said memory outputting one of said stored offset values in response to an address signal indicative of said frequency selection; and
      a digital-to-analog converter (DAC) for converting any of said stored offset values into said offset signal.

7. The circuit of claim 6 wherein said generating means further comprises means for varying said offset signal in response to changes in the impedance of, or the power supplied to, said load.

8. The circuit of claim 6 wherein said address signal is provided by a frequency divider in said tuning means.

9. The circuit of claim 6 wherein said applying means comprises:
   a first adder for adding an audio signal to said offset signal from said DAC; and
   a second adder at the input to said VCO for adding the output of said first adder to a tuning signal from said tuning means.

10. The circuit of claim 9 wherein:
    said connecting means comprises a first switch for connecting said VCO to said load; and
    said applying means further comprises a second switch for connecting said DAC to said first adder, said second switch being activated when said first switch is activated.

11. A frequency synthesizer circuit comprising:
    a voltage controlled oscillator (VCO) for generating a frequency signal;
    means for tuning said VCO signal to a selectable frequency;
    means for connecting said VCO to a load, said VCO signal having an instantaneous frequency change when said VCO is connected to said load;
    means for generating a predetermined offset signal for counteracting said instantaneous frequency change in said VCO signal; and
    means for applying said offset signal to said VCO when said VCO is connected to said load, said offset signal acting to substantially reduce said instantaneous frequency change in said VCO signal; and
    wherein said generating means comprises:
       means for computing a value for said offset signal as a function of the frequency selected for said VCO signal; and
       a digital-to-analog converter (DAC) for converting said value into said offset signal.

12. The circuit of claim 11 wherein said generating means further comprises means for varying said offset signal in response to changes in the impedance of, or the power supplied to, said load.

13. The circuit of claim 11 wherein said applying means comprises:
    a first adder for adding an audio signal to said offset signal from said DAC; and
    a second adder at the input to said VCO for adding the output of said first adder to a tuning signal from said tuning means.

14. The circuit of claim 13 wherein:
    said connecting means comprises a first switch for connecting said VCO to said load; and
    said applying means further comprises a second switch for connecting said DAC to said first adder, said second switch being activated when said first switch is activated.

15. In a frequency synthesizer including a voltage controlled oscillator (VCO) for generating a frequency signal, the frequency of said VCO signal being tunable in proportion to an input voltage applied to said VCO, said VCO being switchably connected to or disconnected from a load, a method for reducing a frequency transient appearing at the output of said VCO when said VCO is connected to said load, the method comprising the steps of:
    measuring the magnitude and direction of said frequency transient;
    measuring the magnitude and direction of the frequency deviation of said VCO signal in response to a reference voltage;
    generating a frequency correction voltage which, based on said measurements, would cause said VCO signal to deviate in an equal amplitude but in an opposite direction to said frequency transient, said frequency correction voltage being generated in a digital-to-analog converter (DAC) which converts a predetermined digital value into said frequency correction voltage; and
    applying said frequency correction voltage to said VCO when said VCO is connected to said load so as to substantially cancel said frequency transient.

16. The method of claim 15 wherein said digital value is selected from a plurality of digital values stored in a memory based on the frequency of said VCO signal.

17. The method of claim 15 wherein said digital value is computed as a function of the frequency of said VCO signal.

* * * * *